(12) United States Patent
Badanahatti et al.

(10) Patent No.: US 9,971,538 B2
(45) Date of Patent: May 15, 2018

(54) LOAD BALANCING AND SERVICE DIFFERENTIATION WITHIN A DISPERSED STORAGE NETWORK

(71) Applicant: International Business Machines Corporation, Armonk, NY (US)

(72) Inventors: Venkata Giri Badanahatti, Bloomingdale, IL (US); Harsha Hegde, Hawthorn Woods, IL (US)

(73) Assignee: International Business Machines Corporation, Armonk, NY (US)

(*) Notice: Subject to any disclaimer, the term of this patent is extended or adjusted under 35 U.S.C. 154(b) by 0 days. days.

(21) Appl. No.: 15/356,929

(22) Filed: Nov. 21, 2016

(65) Prior Publication Data

US 2017/0153853 A1 Jun. 1, 2017

Related U.S. Application Data

(60) Provisional application No. 62/260,743, filed on Nov. 30, 2015.

(51) Int. Cl.
*H03M 13/00* (2006.01)
*G11C 29/00* (2006.01)
(Continued)

(52) U.S. Cl.
CPC ............ *G06F 3/0635* (2013.01); *G06F 3/064* (2013.01); *G06F 3/067* (2013.01); *G06F 3/0611* (2013.01);
(Continued)

(58) Field of Classification Search
CPC .... G06F 3/0635; G06F 3/0611; G06F 3/0617; G06F 3/0619; G06F 3/064; G06F 3/0659;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Christine T. Tu
(74) *Attorney, Agent, or Firm* — Garlick & Markison; Timothy W. Markison; Harry S. Tyson, Jr.

(57) ABSTRACT

Methods for use in a dispersed storage network (DSN) to determine appropriate resources for storing data. In various examples, a network control unit obtains status information relating to the DSN. The status information, which may be updated periodically, may include information relating to storage unit utilization, network loading and performance levels, data size indicators, access profiles specifying differentiated service levels, etc. Based on the status information, the network control unit maps each of a plurality of data classes to a plurality of sets of storage units, and generates network control information based on the mapping. The network control information, which may include routing instructions and storage set utilization information, is issued to a network routing unit for use in facilitating storage (e.g., via IP address translation) of differing classes of data in the sets of storage units in accordance with the mapping.

20 Claims, 8 Drawing Sheets

(51) Int. Cl.
*G06F 3/06* (2006.01)
*G06F 11/10* (2006.01)
*G06F 11/07* (2006.01)
*G06F 17/30* (2006.01)
*H04L 29/08* (2006.01)
*H03M 13/15* (2006.01)
*H04L 12/18* (2006.01)

(52) U.S. Cl.
CPC .......... *G06F 3/0617* (2013.01); *G06F 3/0619* (2013.01); *G06F 3/0659* (2013.01); *G06F 11/0727* (2013.01); *G06F 11/1076* (2013.01); *G06F 11/1092* (2013.01); *G06F 17/30569* (2013.01); *H03M 13/1515* (2013.01); *H03M 13/616* (2013.01); *H04L 12/18* (2013.01); *H04L 67/1008* (2013.01); *H04L 67/1097* (2013.01); *H04L 67/2823* (2013.01)

(58) Field of Classification Search
CPC .... G06F 3/067; G06F 11/727; G06F 11/1076; G06F 11/1092; G06F 17/30569; H03M 13/1515; H03M 13/1616; H04L 12/18; H04L 67/1008; H04L 67/1097; H04L 67/2823
USPC .......................................... 714/763, 764, 767
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0002503 A1* | 1/2003 | Brewer | H04L 47/10 370/392 |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Saran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2010/0318917 A1* | 12/2010 | Holladay | H04N 21/43615 715/735 |
| 2014/0351545 A1* | 11/2014 | Nakajima | G06F 3/0607 711/170 |
| 2015/0155969 A1* | 6/2015 | Volvovski | H04L 1/0045 714/776 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.
Chung; An Automatic Data Segmentation Method for 3D Measured Data Points; National Taiwan University; pp. 1-8; 1998.
Plank, T1: Erasure Codes for Storage Applications; FAST2005, 4th Usenix Conference on File Storage Technologies; Dec. 13-16, 2005; pp. 1-74.
Wildi; Java iSCSi Initiator; Master Thesis; Department of Computer and Information Science, University of Konstanz; Feb. 2007; 60 pgs.
Legg; Lightweight Directory Access Protocol (LDAP): Syntaxes and Matching Rules; IETF Network Working Group; RFC 4517; Jun. 2006; pp. 1-50.
Zeilenga; Lightweight Directory Access Protocol (LDAP): Internationalized String Preparation; IETF Network Working Group; RFC 4518; Jun. 2006; pp. 1-14.
Smith; Lightweight Directory Access Protocol (LDAP): Uniform Resource Locator; IETF Network Working Group; RFC 4516; Jun. 2006; pp. 1-15.
Smith; Lightweight Directory Access Protocol (LDAP): String Representation of Search Filters; IETF Network Working Group; RFC 4515; Jun. 2006; pp. 1-12.
Zeilenga; Lightweight Directory Access Protocol (LDAP): Directory Information Models; IETF Network Working Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

The Open Networking Foundation, OpenFlow Switch Specification, Version 1.5.0 (Protocol version 0x06), Dec. 19, 2014, 277 pgs.

\* cited by examiner

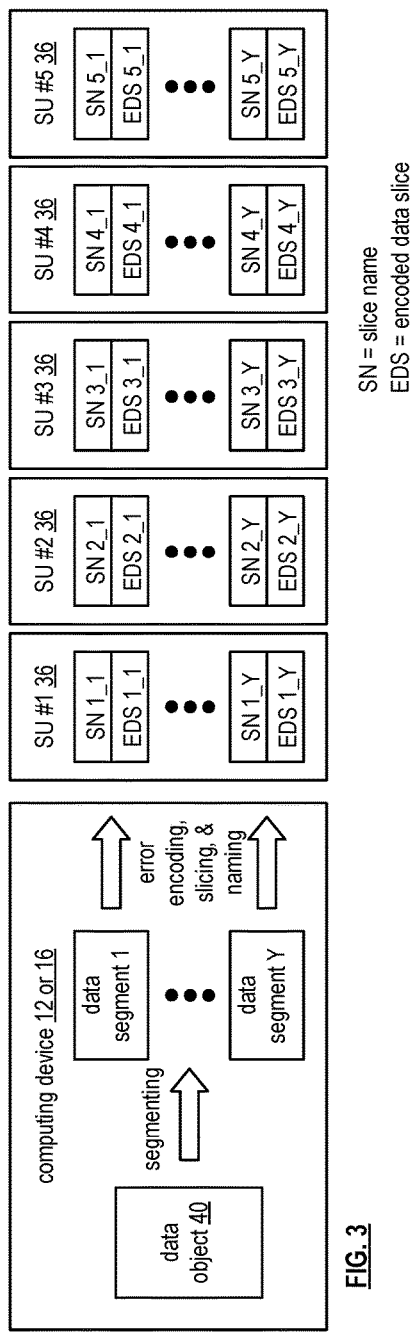
FIG. 3
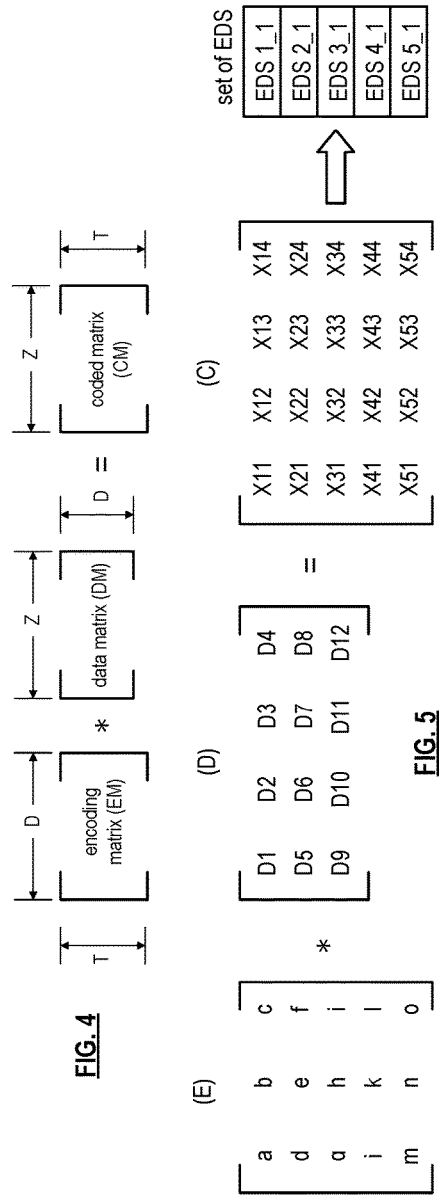
FIG. 4
FIG. 5
FIG. 6

LOAD BALANCING AND SERVICE DIFFERENTIATION WITHIN A DISPERSED STORAGE NETWORK

CROSS-REFERENCE TO RELATED APPLICATIONS

The present U.S. Utility Patent Application claims priority pursuant to 35 U.S.C. § 119(e) to U.S. Provisional Application No. 62/260,743, entitled "COMMUNICATING DISPERSED STORAGE NETWORK STORAGE UNIT TASK EXECUTION STATUS," filed Nov. 30, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks, and more particularly to selection of storage resources in a dispersed storage network.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote storage system. The remote storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE SEVERAL VIEWS OF THE DRAWING(S)

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of slice naming information for an encoded data slice (EDS) in accordance with the present disclosure;

DETAILED DESCRIPTION OF THE INVENTION

Figure 1:
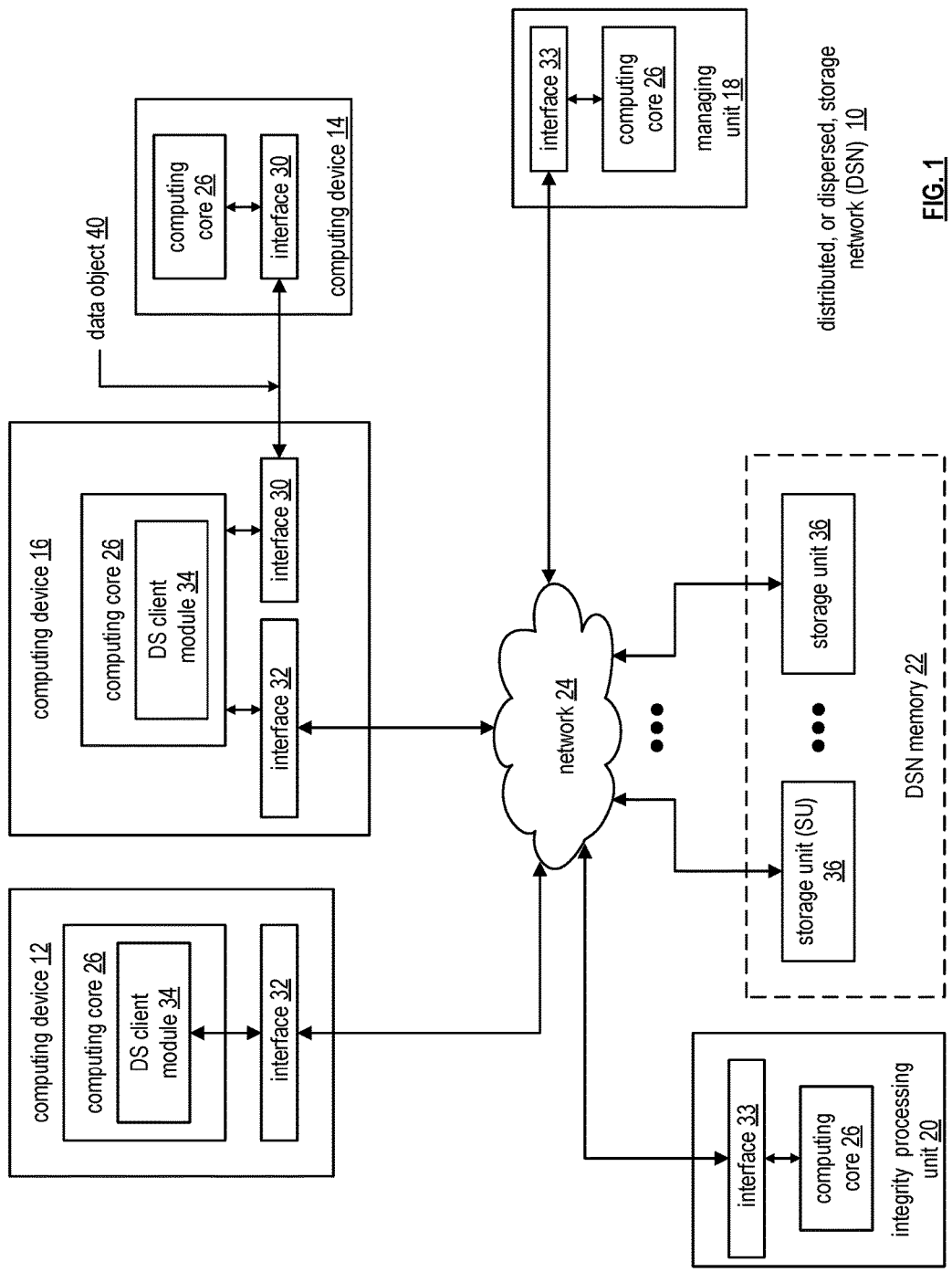
FIG. 1 is a schematic block diagram of an embodiment of a dispersed or distributed storage network (DSN) in accordance with the present disclosure.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
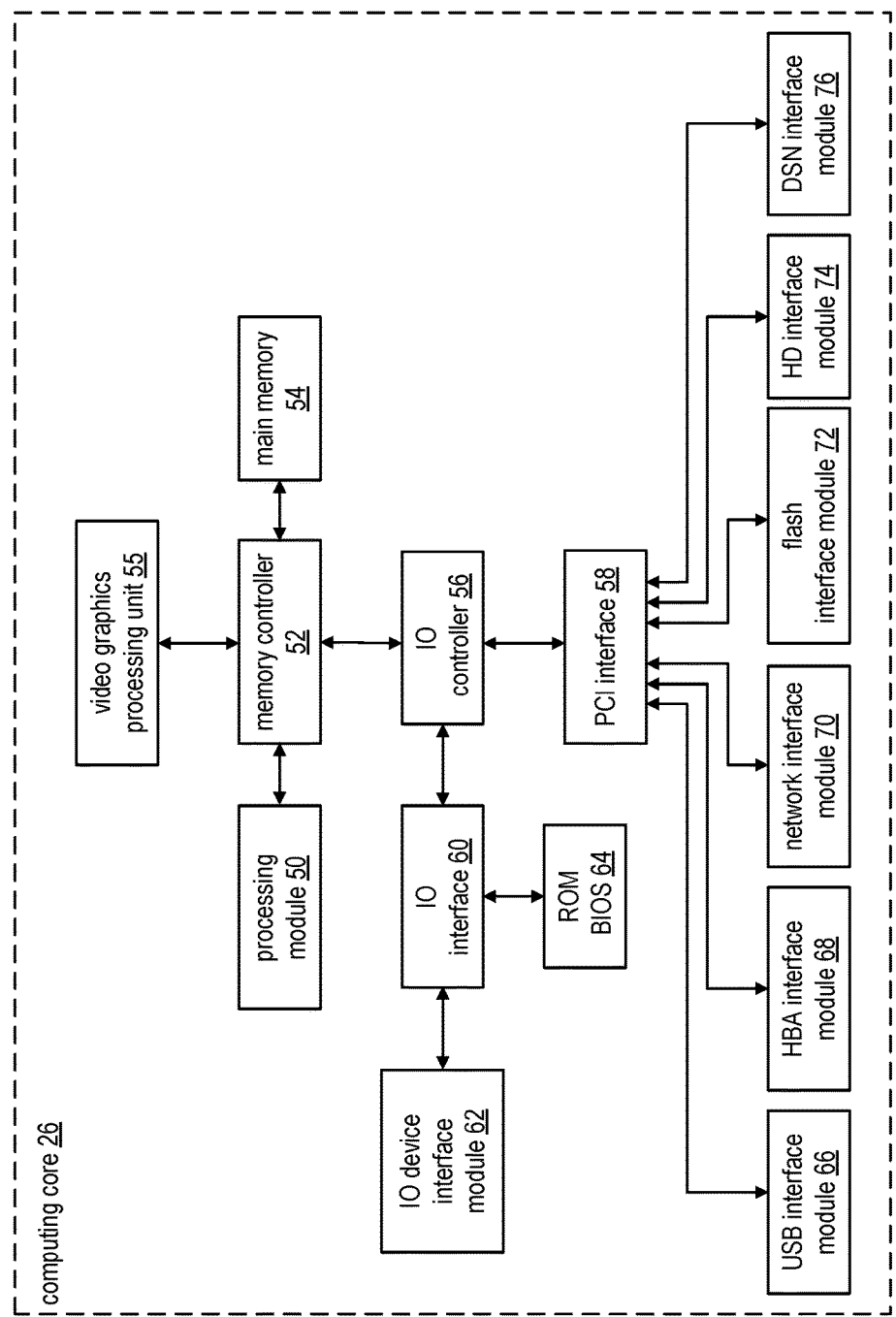
FIG. 2 is a schematic block diagram of an embodiment of a computing core in accordance with the present disclosure.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed storage (DS) error encoded data.

Each of the storage units 36 is operable to store DS error encoded data and/or to execute (e.g., in a distributed manner) maintenance tasks and/or data-related tasks. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, maintenance tasks (e.g., rebuilding of data slices, updating hardware, rebooting software, restarting a particular software process, performing an upgrade, installing a software patch, loading a new software revision, performing an off-line test, prioritizing tasks associated with an online test, etc.), etc.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation/access requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10. Examples of load balancing, service differentiation and dynamic resource selection for data access operations are discussed in greater detail with reference to FIGS. 9-13.

To support data storage integrity verification within the DSN 10, the integrity processing unit 20 (and/or other devices in the DSN 10) may perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, and/or distributed among the storage units 36.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of five, a decode threshold of three, a read threshold of four, and a write threshold of four. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value $X11=aD1+bD5+cD9$, $X12=aD2+bD6+cD10$, . . . $X53=mD3+nD7+oD11$, and $X54=mD4+nD8+oD12$.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
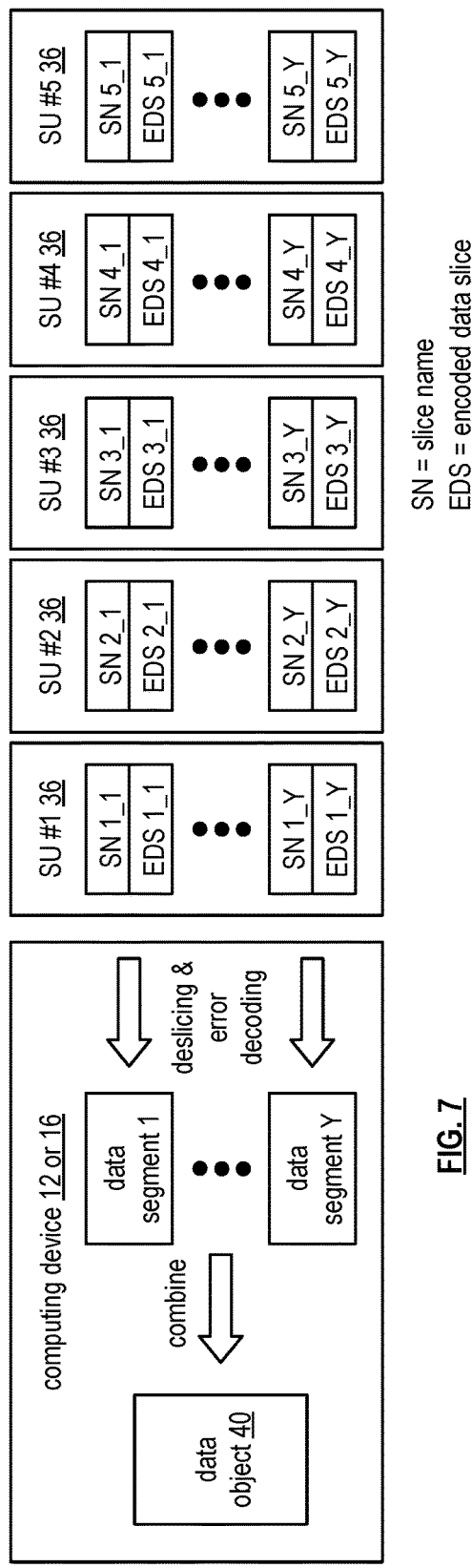
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
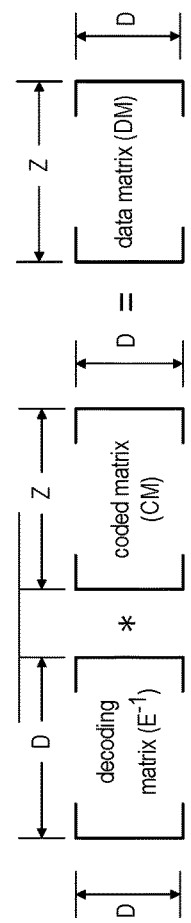
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

In a dispersed storage network, it is natural for some stored data (also referred to herein as "data objects") to be of greater importance and/or different size than other stored data. Often, the relative importance of a given piece of data is a dynamic property that evolves over time. Likewise, the performance and reliability of storage units and storage sets may vary. Some storage sets may be of relatively high performance, while others may be more suitable for long-term reliable storage. Knowing the relative importance, size, frequency of access, etc. of data may be useful when determining appropriate resources for storing the data. As described more fully below in conjunction with the novel examples of FIGS. 9 and 10, load balancing requests to DSN memory and differentiated levels of service within a DSN memory are enabled using rules and methods for data object storage and retrieval based on, for example, one or more of a destination storage vault, data object size, protocol, API type, level of service associated with a user, and network traffic conditions. In other novel examples, such as described in conjunction with FIGS. 11 and 12, updated DSN information is utilized for dynamic resource selection and routing (e.g., for purposes of improving performance or fault tolerance) when storing relatively large, multi-part data.

Figure 9:
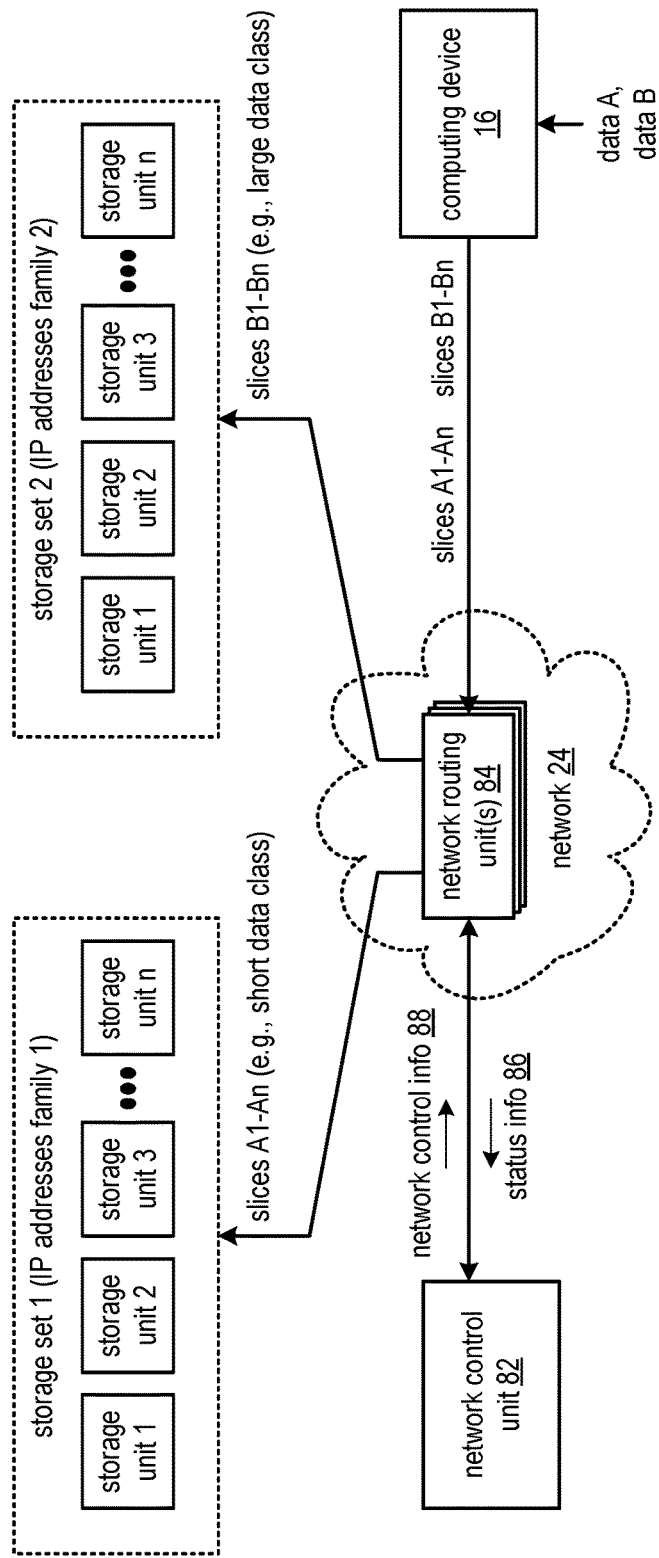
FIG. 9 is a schematic block diagram of another embodiment of a DSN performing load balancing and service differentiation in accordance with the present disclosure.

Referring now to FIG. 9, a schematic block diagram of an example of a DSN performing load balancing and service level differentiation in accordance with the present disclosure is shown. The illustrated DSN includes a plurality of storage units, the network 24 of FIG. 1, a network control unit 82, and the computing device 16 of FIG. 1. The network control unit 82 may be implemented utilizing one or more of a computing device 16, a server, a user device, and a storage unit 36 of FIG. 1. Network 24 includes at least one network routing unit 84. The network routing unit(s) 84 may be implemented utilizing one or more of a router, a switch, a bridge, a server, a computing device 16, and a storage unit 36.

The illustrated DSN memory includes a plurality of storage sets, with each storage set including storage units 1-*n* (where, for example, n is an integer greater than or equal to three). Each storage unit may be implemented utilizing the storage unit 36 of FIG. 1, and each of the storage units includes a DS client module 34, a processing module and memory (not separately illustrated). The storage units of a storage set may be located at a same physical location (site) or located at multiple physical locations without departing from the technology as described herein.

In general, DSN memory stores a plurality of dispersed storage (DS) error encoded data. The DS error encoded data may be encoded in accordance with one or more examples described with reference to FIGS. 3-6, and organized (for example) in slice groupings or pillar groups. The data that is encoded into the DS error encoded data may be of any size and/or of any content. For example, the data may be one or more digital books, a copy of a company's emails, a large-scale Internet search, a video security file, one or more entertainment video files (e.g., television programs, movies, etc.), data files, and/or indexing and key information for use in dispersed storage operations.

In the illustrated DSN memory, a first set of storage units (e.g., storage set 1) of the plurality of storage units is affiliated with a first family of Internet Protocol (IP) addresses and a second set of storage units (e.g., storage set 2) of the plurality of storage units is affiliated with a second family of IP addresses, where storage sets are utilized to store data of a common association (e.g., data from a common group of users). In this example, data A and data B are dispersed storage error encoded utilizing an information dispersal algorithm (IDA) to produce sets of encoded data slices A1-An and B1-Bn that are sent for storage, utilizing IP messages that include an associated IP address, to corresponding sets of storage units, where a set of encoded data slices includes an IDA width number of encoded data slices, and where a decode threshold number of encoded data slices are required to recover the data. A storage unit may be affiliated with two or more storage sets and two or more families of IP addresses. For example, each storage set includes storage units 1-*n*, where n=IDA width. The DSN functions as described below to select DSN resources.

In an example of operation of DSN resource selection, when the computing device 16 is processing data, the network control unit 82 obtains status information 86 with regards to the DSN, where the status information 86 includes one or more of a network traffic/loading level, a network performance level, a storage unit reliability level, a data size indicator, a slice size indicator, a data type indicator, an accessing entity identifier (ID), and an access profile (e.g., access frequency, performance requirement, availability requirement).

Obtaining the status information includes at least one of interpreting a network query, receiving a portion of the status information 86 from the computing device 16, receiving another portion of the status information 86 from at least some of the storage units, receiving the status information 86 from a network routing unit 84 when the network routing unit 84 generates the status information 86, and interpreting a test result. The status information may be updated on a periodic basis and/or in response to a pending data access request (e.g., a read or write request).

Having obtained the status information 86, the network control unit 82, for each of a plurality of data classes (e.g., short data/slices, large data/slices, critical data or other types of data, a particular data name, a source name/data owner identifier, a range of source names, a slice name, a range of slice names, data availability requirements, desired data storage reliability levels, system registry information, etc.), maps the data class to a storage set based on the status information 86 and a mapping approach. The mapping approach may include, for example, mapping a short data class to a higher performing storage set (e.g., storage set 1) and mapping a large data class for long-term reliable storage to another storage set (e.g., storage set 2) associated with higher than average storage reliability.

Having mapped each data class to a particular storage set, the network control unit 82 issues network control information 88 to the network routing unit(s) 84. Issuing the network control information 88 may include generating the network control information 88 based on the mapping of the data class to the particular storage set and transmitting the network control information 88 to at least one network routing unit 84. The network control information 88 includes one or more of routing instructions (e.g., IP address translations) and storage set utilization information (e.g., when and/or under what conditions to use particular storage sets). For example, the network control unit 82 generates the network control information 88 to translate IP addresses of IP messages, from the computing device 16 and affiliated with the short data class, to the IP addresses family 1 of the storage set 1 and the network control unit 82 generates further network control information to translate IP addresses of further IP messages, from the computing device 16 and affiliated with the large data class, to the IP addresses family 2 of the storage set 2. The network control information 88 may be stored in one or more routing tables of the network routing unit 84. As described more fully below in conjunction with FIG. 11, the network control information 88 may further include (updated) routing information relating to computing devices and/or other resources of the DSN associated with a particular storage set.

The network routing unit 84 routes network traffic associated with the accessing of the data utilizing the plurality of storage units in accordance with the network control information. For example, the network routing unit 84 routes IP messages that includes slices A1-An affiliated with the short data class to the storage set 1 and routes other IP messages that includes slices B1-Bn affiliated with the large data class to the storage set 2. In other examples, data object read/write requests may be based on differing levels of service associated users of a vault or the vault itself (e.g., requests from a user or vault having a highest associated level of service may be routed to a storage unit/storage set that is least loaded as determined in real time or near real time). In another example, data objects destined for a vault that utilizes a particular data storage service/API type may be routed to a specific storage set as directed by the network control information 88.

Figure 10:
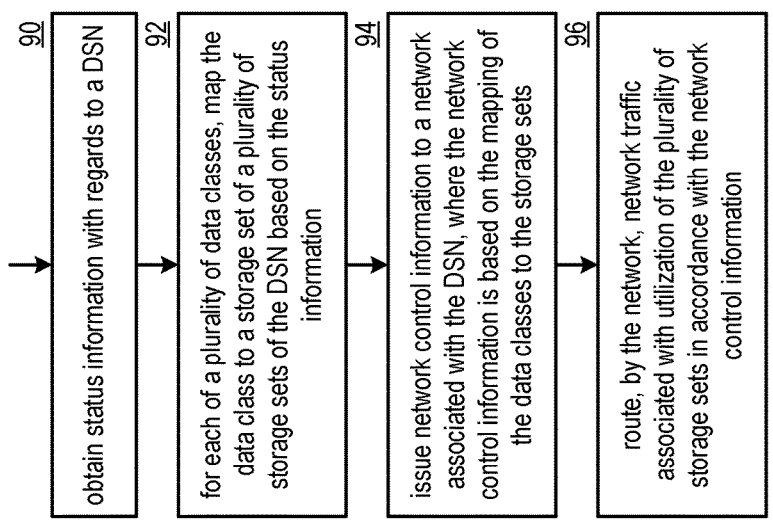
FIG. 10 is a logic diagram illustrating an example of selecting DSN resources in accordance with the present disclosure.

FIG. 10 is a logic diagram illustrating an example of selecting DSN resources in accordance with the present disclosure. In this example, the method begins or continues at a step 90 where a processing module (e.g., of a computing device 16) obtains status information with regards to a DSN. Obtaining the status information may include at least one of interpreting a network query, receiving a portion of the status information from a processing unit, receiving another portion of the status information from at least some of the plurality of storage units, and interpreting a test result.

For each of a plurality of data classes, the method continues at step 92 where the processing module maps the data class to a storage set of a plurality of storage sets of the DSN based on the status information. The mapping includes associating the data class with a storage set based on a mapping approach and at least some of the status information. Next, at step 94, the processing module issues network control information 88 to a network associated with the DSN, where the network control information 88 is based on the mapping of the data classes to the storage sets. The issuing includes generating the network control information 88 based on the mapping of the data class to a particular storage set and transmitting the network control information 88 to a network routing unit 84 of the network.

The method continues at step 96 where the network routes network traffic associated with utilization of the plurality of storage sets in accordance with the network control information 88. For example, the network routing unit 84 forwards received IP messages from an original received IP address to a translated IP address in accordance with the network control information 88.

Figure 11:
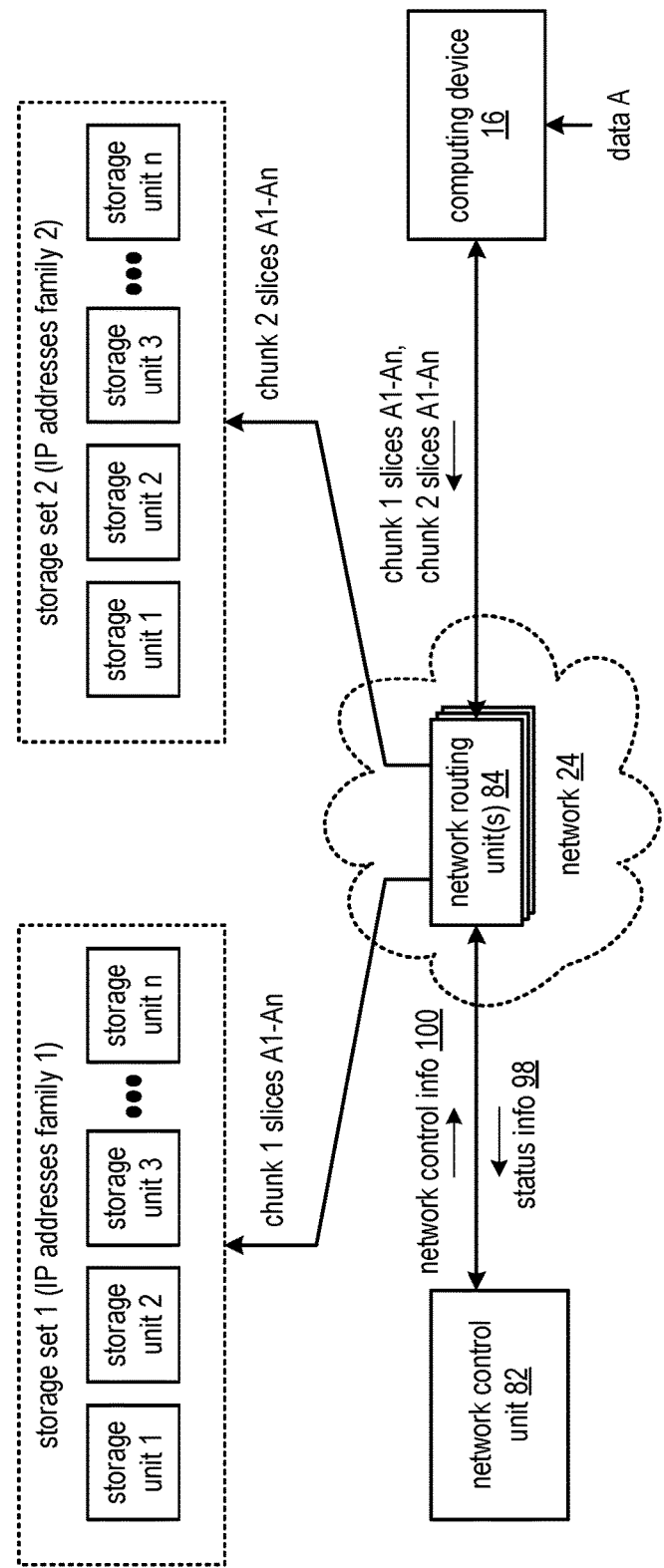
FIG. 11 is a schematic block diagram of another embodiment of a DSN performing dynamic resource selection in accordance with the present disclosure.

FIG. 11 is a schematic block diagram of another embodiment of a DSN performing dynamic resource selection in accordance with the present disclosure. The illustrated DSN includes a plurality of storage units, the network 24 of FIG. 1, a network control unit 82, and the computing device 16 of FIG. 1. The network control unit 82 may be implemented utilizing one or more of a computing device 16, a server, a user device, and a storage unit 36 of FIG. 1. Network 24 includes at least one network routing unit 84. The network routing unit(s) 84 may be implemented utilizing one or more of a router, a switch, a bridge, a server, a computing device 16, and a storage unit 36.

The illustrated DSN memory includes a plurality of storage sets, with each storage set including storage units 1-$n$ (where, for example, n is an integer greater than or equal to three). Each storage unit may be implemented utilizing the storage unit 36 of FIG. 1, and each of the storage units includes a DS client module 34, a processing module and memory (not separately illustrated). The storage units of a storage set may be located at a same physical location (site) or located at multiple physical locations without departing from the technology as described herein.

In the illustrated DSN memory, a first set of storage units (e.g., storage set 1) of the plurality of storage units is affiliated with a first family of Internet protocol (IP) addresses and a second set of storage units (e.g., storage set 2) of the plurality of storage units is affiliated with a second family of IP addresses, where storage sets are utilized to store data of a common association (e.g., data from a common group of users). In this example, data A is dispersed storage error encoded utilizing an information dispersal algorithm (IDA) to produce sets (or "chunks") of encoded data slices that are sent for storage, utilizing IP messages that include an associated IP address, to corresponding sets of storage units, where a set of encoded data slices includes an IDA width number of encoded data slices, and where a decode threshold number of encoded data slices are required to recover the data. A storage unit may be affiliated with two or more storage sets and two or more families of IP addresses. For example, each storage set includes storage units 1-$n$, where n=IDA width. The DSN functions as described below to select DSN resources for use in storing multi-part data.

In an example of operation of DSN resource selection, when the computing device 16 is processing data, the network control unit 82 obtains status information 98 with regards to the DSN, where the status information 98 includes one or more of a network traffic/loading level, a network performance level, a storage unit reliability level, a data size indicator, a slice size indicator, a data type indicator, an accessing entity identifier (ID), and an access profile (e.g., access frequency, performance requirement, availability requirement).

Obtaining the status information includes at least one of interpreting a network query, receiving a portion of the status information 98 from the computing device 16, receiving another portion of the status information 98 from at least some of the storage units, receiving the status information 98 from a network routing unit 84 when the network routing unit 84 generates the status information 98, and interpreting a test result. The status information may be updated on a periodic basis and/or in response to a pending data access request (e.g., a read or write request).

Having obtained the status information 98, the network control unit 82, for each of two or more groups of the data (e.g., chunks or sets of encoded data slices), maps the group of data (e.g., affiliated encoded data slices) to a storage set based on the status information 98 with regards to the group of data. The mapping includes associating the group of data with a storage set based on a mapping approach and at least some of the status information 98. The mapping approach may involve mapping a higher priority chunk to a higher performing storage set (e.g., storage set 1), and mapping a lower priority chunk to a lower performing storage set (e.g., storage set 2, when the storage set 2 is associated with lower cost and/or lower performance). In other examples, mapping may enable and/or facilitate parallel processing of multi-part data, flow control/balancing of uploads to different storage sets (e.g., the chunks may be evenly distributed across the storage sets), data duplication or rebuilding operations, limiting the amount of data written to a particular storage set or storage unit, etc. The network control unit 82 may be configured to update mapping and other actions at any time during processing of a multi-part data upload. Updates may be triggered by a need to perform backup operations, reduce or increase the amount of data being transferred to/from one or more storage sets, new upload requests, etc.

Having mapped each group of data to a particular storage set, the network control unit 82 issues network control information 100 to the network routing unit(s) 84. The issuing includes generating the network control information 100 based on the mapping of the group of data to the particular storage set and transmitting the network control information 100 to at least one network routing unit 84. The network control information 100 includes one or more of routing instructions (e.g., IP address translations) and storage set utilization information (e.g., when and/or under what conditions to use particular storage sets). For example, the network control unit 82 generates the network control information 100 to translate IP addresses of IP messages, from the computing device 16 and affiliated with a first chunk, to the IP addresses family 1 of the storage set 1. The network control unit 82 generates further network control information 100 to translate IP addresses of further IP messages, from the computing device 16 and affiliated with a second chunk, to the IP addresses family 2 of the storage set 2.

The network routing unit 84 routes network traffic associated with the accessing of the data utilizing the plurality of storage units in accordance with the network control information 100. For example, the network routing unit 84 routes IP messages that includes chunk 1 slices A1-An affiliated with a first or higher priority chunk to the storage set 1 and routes other IP messages that includes chunk 2 slices A1-An affiliated with a second or lower priority chunk to the storage set 2. The chunk 1 slices and chunk 2 slices of this example are generated from differing portions of a common data object A.

In addition to storage set routing information, the network control information 100 issued to the network routing unit(s) 84 may further include (updated) routing information relating to computing devices and/or other resources of the DSN, for use by the network routing unit(s) 84 in directing data access requests (e.g., external client requests) to appropriate DSN resources. For example, an IP address family identified in the network control information may include the IP address of a computing device(s) that generates encoded data for storage in a storage set associated with the IP address family.

Figure 12:
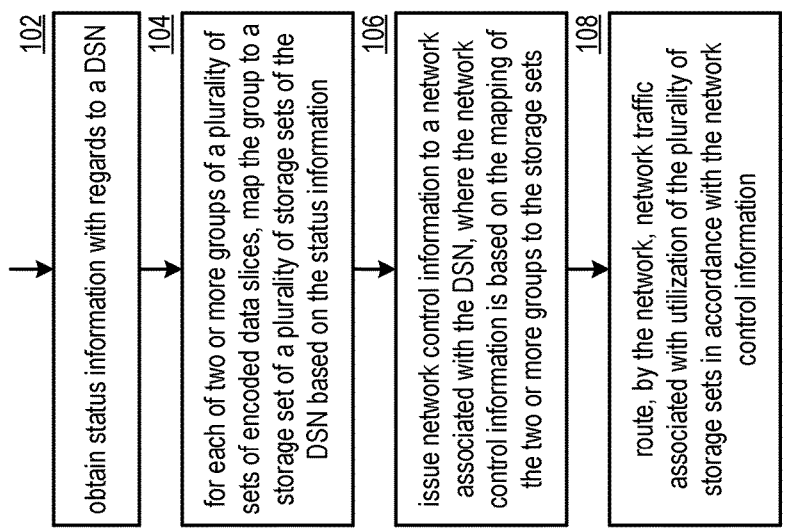
FIG. 12 is a logic diagram illustrating another example of selecting DSN resources in accordance with the present disclosure.

FIG. 12 is a logic diagram illustrating another example of selecting DSN resources in accordance with the present disclosure, where the example includes similar steps to FIG. 10. In this example, the method begins or continues at a step 102 where a processing module (e.g., of a computing device 16) obtains status information 86 with regards to a DSN. Obtaining the status information 86 may include at least one of interpreting a network query, receiving a portion of the status information from a processing unit, receiving another portion of the status information from at least some of the plurality of storage units, and interpreting a test result. For each of two or more groups of a plurality of sets of encoded data slices (e.g., each group associated with one or more chunks of data), the method continues at step 104 where the processing module maps the groups to a storage set of a plurality of storage sets of the DSN based on the status information 86. The mapping includes associating the data group with a storage set based on a mapping approach and at least some of the status information.

Next, at step 106, the processing module issues network control information 100 to a network associated with the DSN, where the network control information 100 is based on the mapping of the group(s) to the storage sets. The issuing includes generating the network control information 100 based on the mapping of the group(s) to particular storage sets and transmitting the network control information 100 to a network routing unit 84 of the network. The method continues at step 108 where the network routes network traffic associated with utilization of the plurality of storage sets in accordance with the network control information. For example, the network routing unit 84 forwards received IP messages from an original received IP address to a translated IP address in accordance with the network control information 88.

The methods described above in conjunction with the network control unit 82 and storage units can alternatively be performed by other modules (e.g., DS client modules 34) of a dispersed storage network or by other devices (e.g., managing unit 20). Any combination of a first module, a second module, a third module, a fourth module, etc. of the computing devices and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information. A computer readable memory/storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the DSN having a network routing unit and storage resources including a plurality of sets of storage units, the method comprises:
    obtaining status information relating to storage units of the plurality of sets of storage units;
    mapping, based at least in part on the status information, each of a plurality of data classes to the plurality of sets of storage units, including mapping at least a first data class to a first set of storage units and a second data class to a second set of storage units, the plurality of data classes relating to characteristics of data objects to be stored in a dispersed manner in the plurality of sets of storage units;
    generating network control information based on the mapping, the network control information including at least one of routing instructions or storage set utilization information for use in facilitating storage of data of the first data class and the second data class in the plurality of sets of storage units; and
    issuing the network control information to the network routing unit.

2. The method of claim 1, wherein obtaining status information relating to the storage units includes at least one of: interpreting a network query, receiving a portion of the status information from a computing device of the DSN, receiving a portion of the status information from at least one of the storage units of the plurality of sets of storage units, receiving the status information from the network routing unit, or interpreting a test result.

3. The method of claim 1, wherein the status information includes information relating to at least one of: a utilization level of the storage units, a DSN network loading level, a DSN network performance level, a storage unit access performance level, a data storage reliability level, a data size indicator, a slice size indicator, an accessing entity identifier (ID), or an access profile.

4. The method of claim 3, wherein the status information is updated on a periodic basis.

5. The method of claim 1, wherein the plurality of data classes include data classes relating to at least one of: data types, data object size indicators, slice size indicators, data owner identifiers, data availability requirements, desired data storage reliability levels, source names, data names, or system registry information.

6. The method of claim 1, wherein the first set of storage units of the plurality of sets of storage units is affiliated with a first family of Internet Protocol (IP) addresses and the second set of storage units of the plurality of sets of storage units is affiliated with a second family of IP addresses, and wherein the network control information references the first family of IP addresses and the second family of IP addresses.

7. The method of claim 1 further comprises:
    receiving a data object for storage;
    dispersed storage error encoding the data object to produce a plurality of sets of encoded data slices, wherein the data object is segmented into a plurality of data segments and wherein each data segment is dispersed storage error encoded into a respective set of encoded data slices; and
    facilitating storage of the plurality of sets of encoded data slices in at least one of the first set of storage units and the second set of storage units in accordance with the network control information.

8. The method of claim 7, wherein facilitating storage of the plurality of sets of encoded data slices includes Internet Protocol (IP) address translation involving IP addresses affiliated with at least one of the first set of storage units or the second set of storage units.

9. A computer readable storage medium comprises:
    at least one memory section that stores operational instructions that, when executed by one or more processing modules of a dispersed storage network (DSN) that include a processor and a memory, causes the one or more processing modules to:
        obtain status information relating to at least one of a plurality of sets of storage units of the DSN or data to be stored in the plurality of sets of storage units;
        map, based at least in part on the status information, each of a plurality of data classes to the plurality of sets of storage units, including mapping at least a first data class to a first set of storage units and a second data class to a second set of storage units, the plurality of data classes relating to characteristics of data objects to be stored in the plurality of sets of storage units;

generate network control information based on the mapping, the network control information including routing instructions for use in facilitating storage of data of the first data class and the second data class in the plurality of sets of storage units; and issue the network control information to a network routing unit of the DSN.

10. The computer readable storage medium of claim 9, wherein obtaining status information relating to at least one of a plurality of sets of storage units includes at least one of: interpreting a network query, receiving a portion of the status information from a computing device of the DSN, receiving a portion of the status information from at least one of storage unit of the plurality of sets of storage units, receiving the status information from a network routing unit, or interpreting a test result.

11. The computer readable storage medium of claim 9, wherein the status information includes information relating to at least one of: a utilization level of storage units of the first set of storage units and the second set of storage units, a DSN network loading level, a DSN network performance level, a storage unit access performance level, a data storage reliability level, a data size indicator, a slice size indicator, an accessing entity identifier (ID), or an access profile.

12. The computer readable storage medium of claim 9 further comprises:

the at least one memory section stores further operational instructions that, when executed by the one or more processing modules, causes the one or more processing modules to obtain updated status information on a periodic basis.

13. The computer readable storage medium of claim 9, wherein the plurality of data classes include data classes relating to at least one of: data types, data object size indicators, slice size indicators, data owner identifiers, data availability requirements, desired data storage reliability levels, source names, data names, or system registry information.

14. The computer readable storage medium of claim 9, wherein the first set of storage units of the plurality of sets of storage units is affiliated with a first family of Internet Protocol (IP) addresses and the second set of storage units of the plurality of sets of storage units is affiliated with a second family of IP addresses, the first family of IP addresses and the second family of IP addresses referenced by the network control information.

15. A computing device of a group of computing devices of a dispersed storage network (DSN), the DSN having a network routing unit and storage resources including a plurality of sets of storage units, the computing device comprises:

a network interface;

a local memory; and a processing module operably coupled to the network interface and the local memory, wherein the processing module operates to:

obtain, via the network interface, status information relating to storage units of the plurality of sets of storage units;

map, based at least in part on the status information, each of a plurality of data classes to the plurality of sets of storage units, including mapping at least a first data class to a first set of storage units and a second data class to a second set of storage units, the plurality of data classes relating to characteristics of data objects to be stored in the plurality of sets of storage units;

generate network control information based on the mapping, the network control information including at least one of routing instructions or storage set utilization information for use in facilitating storage of data of the first data class and the second data class in the plurality of sets of storage units; and issue, via the network interface, the network control information to the network routing unit.

16. The computing device of claim 15, wherein obtaining status information relating to the storage units includes at least one of: interpreting a network query, receiving a portion of the status information from a computing device of the DSN, receiving a portion of the status information from at least one of the storage units of the plurality of sets of storage units, receiving the status information from the network routing unit, or interpreting a test result.

17. The computing device of claim 15, wherein the status information includes information relating to at least one of: a utilization level of the storage units, a DSN network loading level, a DSN network performance level, a storage unit access performance level, a data storage reliability level, a data size indicator, a slice size indicator, an accessing entity identifier (ID), or an access profile.

18. The computing device of claim 15, wherein the processing module further operates to:

obtain, via the network interface, updated status information on a periodic basis.

19. The computing device of claim 15, wherein the plurality of data classes include data classes relating to at least one of: data types, data object size indicators, slice size indicators, data owner identifiers, data availability requirements, desired data storage reliability levels, source names, data names, or system registry information.

20. The computing device of claim 15, wherein the first set of storage units of the plurality of sets of storage units is affiliated with a first family of Internet Protocol (IP) addresses and the second set of storage units of the plurality of sets of storage units is affiliated with a second family of IP addresses, the first family of IP addresses and the second family of IP addresses referenced by the network control information.

* * * * *